US011223129B2

(12) United States Patent
Baranski

(10) Patent No.: US 11,223,129 B2
(45) Date of Patent: Jan. 11, 2022

(54) CONNECTOR FOR ANTENNAS, A GLAZING COMPRISING THE CONNECTOR AND AN ANTENNA SYSTEM COMPRISING THE CONNECTOR

(71) Applicant: Pilkington Group Limited, Lancashire (GB)

(72) Inventor: Detlef Baranski, Marl (DE)

(73) Assignee: PILKINGTON GROUP LIMITED, Lancashire (GB)

( * ) Notice: Subject to any disclaimer, the term of this patent is extended or adjusted under 35 U.S.C. 154(b) by 676 days.

(21) Appl. No.: 16/301,402

(22) PCT Filed: May 12, 2017

(86) PCT No.: PCT/GB2017/051332
§ 371 (c)(1),
(2) Date: Nov. 13, 2018

(87) PCT Pub. No.: WO2017/194961
PCT Pub. Date: Nov. 16, 2017

(65) Prior Publication Data
US 2020/0176872 A1    Jun. 4, 2020

(51) Int. Cl.
*H01Q 5/50* (2015.01)
*H01Q 1/32* (2006.01)
(Continued)

(52) U.S. Cl.
CPC .............. *H01Q 5/50* (2015.01); *H01P 3/081* (2013.01); *H01Q 1/325* (2013.01); *H01Q 1/40* (2013.01);
(Continued)

(58) Field of Classification Search
CPC ........................... H01Q 1/1278; H01Q 1/1285
See application file for complete search history.

(56) References Cited

U.S. PATENT DOCUMENTS 4,160,977 A * 7/1979 Davis .................... H01Q 1/1271
343/711
4,495,505 A * 1/1985 Shields .................. H01Q 9/065
333/26
(Continued)

FOREIGN PATENT DOCUMENTS

CN     102694242 A   9/2012
DE        4415675 C1   8/1995
(Continued)

OTHER PUBLICATIONS

International Search Report (PCT/ISA/210) dated Aug. 21, 2017, by the European Patent Office as the International Searching Authority for International Application No. PCT/GB2017/051332.
(Continued)

*Primary Examiner* — Ab Salam Alkassim, Jr.
(74) *Attorney, Agent, or Firm* — Buchanan Ingersoll & Rooney PC

(57) ABSTRACT

A connector for at least two antennas, comprising a base layer, first and second electrical conductors secured on the base layer, wherein the first electrical conductor is suitable for signals in a first frequency band F1 and the second electrical conductor is suitable for signals in a second frequency band F2, wherein F2 is higher than F1; and first and second electrical conductors comprise first and second input portions, first and second output portions and first and second linear portions extending between first and second input portions and first and second output portions respectively, wherein first and second linear portions extend substantially parallel with each other and wherein an average width of the first linear portion is less than an average width of the second linear portion. A glazing comprising the conductor and an antenna system comprising the conductor
(Continued)

are also claimed. Connector provides superior performance in double band operation.

18 Claims, 9 Drawing Sheets

(51) Int. Cl.
*H01Q 1/40* (2006.01)
*H01R 4/02* (2006.01)
*H01R 4/58* (2006.01)
*H01P 3/08* (2006.01)
*H03H 7/38* (2006.01)

(52) U.S. Cl.
CPC ............... *H01R 4/02* (2013.01); *H01R 4/58* (2013.01); *H03H 7/38* (2013.01)

(56) References Cited

U.S. PATENT DOCUMENTS

| | | | | |
|---|---|---|---|---|
| 4,727,377 | A * | 2/1988 | Yotsuya | H01Q 1/1271 343/711 |
| 4,746,925 | A * | 5/1988 | Toriyama | H01Q 1/1271 343/700 MS |
| 5,049,892 | A * | 9/1991 | Lindenmeier | H01Q 1/1271 343/713 |
| 5,165,057 | A * | 11/1992 | Sharples | H04B 7/0837 343/704 |
| 5,534,879 | A * | 7/1996 | Braun | B32B 17/10036 343/711 |
| 6,239,765 | B1 | 5/2001 | Johnson et al. | |
| 8,077,100 | B2 * | 12/2011 | Baranski | H01Q 1/1285 343/713 |
| 8,576,130 | B2 * | 11/2013 | Dai | H01Q 1/1278 343/713 |
| 9,002,262 | B1 * | 4/2015 | Kuo | H01Q 1/50 455/39 |
| 9,413,059 | B2 * | 8/2016 | Bayram | H01Q 1/248 |
| 9,467,184 | B2 * | 10/2016 | Yosui | H04B 1/12 |
| 10,164,310 | B2 * | 12/2018 | Ikemoto | H05K 1/0216 |
| 2007/0035446 | A1 | 2/2007 | Pan et al. | |
| 2007/0097001 | A1 * | 5/2007 | Sugimoto | H01Q 21/28 343/713 |
| 2009/0096690 | A1 * | 4/2009 | Shimo | H01Q 5/40 343/713 |
| 2010/0328170 | A1 * | 12/2010 | Kuehne | H01Q 1/1278 343/712 |
| 2012/0098715 | A1 * | 4/2012 | Dai | H01Q 1/1278 343/712 |
| 2012/0098716 | A1 * | 4/2012 | Dai | H01Q 1/1271 343/713 |
| 2012/0162016 | A1 | 6/2012 | Lin | |
| 2014/0340279 | A1 * | 11/2014 | Bayram | H01Q 1/242 343/861 |
| 2015/0094009 | A1 * | 4/2015 | Yosui | H04B 1/16 455/307 |
| 2015/0222010 | A1 * | 8/2015 | Dai | H01Q 1/50 343/713 |
| 2015/0222242 | A1 * | 8/2015 | Dai | H01Q 1/325 333/33 |
| 2015/0295296 | A1 * | 10/2015 | Ikemoto | H01Q 21/0075 343/893 |
| 2016/0006107 | A1 * | 1/2016 | Baranski | B32B 17/10376 343/873 |
| 2021/0234254 | A1 * | 7/2021 | Dai | H01Q 1/1278 |

FOREIGN PATENT DOCUMENTS

| | | |
|---|---|---|
| EP | 0411963 A2 | 2/1991 |
| EP | 2924803 A1 | 9/2015 |
| GB | 1335276 A | 10/1973 |
| WO | 0199472 A1 | 12/2001 |
| WO | 2012136411 A1 | 10/2012 |
| WO | 2015112135 A1 | 7/2015 |

OTHER PUBLICATIONS

Written Opinion (PCT/ISA/237) dated Aug. 21, 2017, by the European Patent Office as the International Searching Authority for International Application No. PCT/GB2017/051332.
European Search Report for GB 1608383.4 dated Sep. 12, 2016.

* cited by examiner

CONNECTOR FOR ANTENNAS, A GLAZING COMPRISING THE CONNECTOR AND AN ANTENNA SYSTEM COMPRISING THE CONNECTOR

FIELD OF THE INVENTION

The present invention relates to a connector for at least two antennas, a glazing comprising the connector, and an antenna system comprising the connector. The invention is applicable to, but not limited to, vehicle glazing.

BACKGROUND

Antenna systems comprising at least two antennas for frequency bands up to at least ultrahigh frequency (UHF) band are known, for example a vehicle comprising a body and a glazing fitted in an opening of the body, the glazing comprising two antennas. Such antennas are electrically connectable to an electronic unit, for example an amplifier on the body or on the glazing, by means of a connector.

U.S. Pat. No. 5,534,879A (Flachglas/Braun) discloses a connecting element, suitable for connecting to an electrical arrangement, such as a wire or a printed-on antenna element extending between outer and inner panes of a laminated glass. The connecting element, incorporating a metal foil strip, comprises an inner section connectable to the electrical arrangement and an outer section bondable to an outer surface of the inner pane. Several metal foil strips can run side by side or on different levels separated by insulating interlayers of tear-resistant and heat-resistant plastic, such as a polyimide. A free end of the outer section may have an enlarged area for a plug connection to external circuitry.

DE4415675C1 (Flachglas/Paulus) discloses a connection element suitable for connection to antennas for broadband reception of frequencies up to an ultrahigh frequency band, e.g. 50 MHz to 900 MHz, in a vehicle window. An antenna for FM/VHF, extending between outer and inner panes of a laminated glass, is connected to a connection point for FM/VHF outside the laminated glass by the connection element. The connection element is wrapped around an edge of the inner pane. An antenna for UHF and a virtual electric earth element are formed on the connection element together with a connection point for UHF and a connection point for virtual electric earth. A coaxial cable comprises a core connected to the connection point for UHF and shielding connected to the connection point for virtual electric earth. A single cable is connected to the connection point for FM/VHF.

U.S. Pat. No. 5,049,892 (Hans Kolbe/Lindenmeier) discloses a wire harness comprising a plurality of transmission lines, for example coaxial cables. A plurality of antennas is arranged on a non-conductive sheet installed in a body of a vehicle, connected via four-terminal networks to an interconnection region. Signals are fed from the interconnection region via the wire harness to a receiver.

U.S. Pat. No. 8,077,100B2 (Pilkington/Baranski) discloses a surface contact on a surface of a vehicle glazing, in registration with a coupling region so as to form a transmission line, acting as a band-pass filter for a predetermined frequency band. The coupling region is a portion of an electrical conductor in the vehicle glazing, and a portion of the electrical conductor is configured to form an antenna.

WO2012136411A1 (Saint-Gobain/Reul) discloses a flat conductor connection element for an antenna arranged in a window, and comprises a base layer, a conductor track arranged over the base layer, a first dielectric layer arranged over the conductor track, a shield arranged over the first dielectric layer and a second dielectric layer arranged over the shield. The antenna is connected to the conductor track which runs outwards over an edge of the window and the shield is connected by capacitive coupling to a reference ground via a frame.

US20150222242A1 (PGW/Dai) discloses a connector for a windshield antenna, comprising a base layer and an electrically conductive transmission line located on the base layer. The transmission line comprises four portions: a terminal portion, for connection to an electronic unit; a wide trace portion, a thin trace portion (having a width that is less than the wide trace portion) and a solder patch, for connection to an antenna in the windshield. The thin trace portion has a self-inductance which partly offsets a capacitive reactance of the antenna impedance in the UHF band. The wide trace portion is connected by capacitive coupling to ground, i.e. vehicle body. The wide trace portion forms a shunt capacitor to ground, which contributes to matching the antenna impedance across VHF and UHF bands.

WO2015112135A1 (AGC/Lee) discloses a feeding element coupled to an antenna element disposed on a substrate of a window, wherein the feeding element is disposed on an outer surface of a substrate. The feeding element may be spaced from and capacitively coupled to the antenna element. In a single port configuration, a single feeding element is coupled to a single antenna element. In a multi-port configuration, a single feeding element may be coupled to a plurality of antenna elements. The single feeding element may include separate conductors, each coupled to each separate antenna element. A feeding element may effectively operate as two separate feeding elements consolidated into a single feeding unit.

U.S. Pat. No. 4,746,925A (Toyota/Toriyama) discloses a coaxial cable as a feeder, i.e an antenna connector. A dipole antenna is provided on a surface of a glass window. Width of the dipole antenna is set according to an equation to so that an impedance of the dipole antenna and an impedance of the feeder are matched with each other.

EP2924803A1 (Central Glass/Hirabayashi) discloses a coaxial cable, to connect between a receiver and an antenna element of a vehicular glass antenna. An overlap gap between a positive pole side conductor section and a negative pole side conductor section is adjusted so that an input impedance of the antenna element can be matched to a characteristic impedance of the coaxial cable. Adjustment of overlap gap is to minimise transmission loss and so to improve antenna sensitivity.

Objectives of the Invention

An objective of the invention is to provide an improved connector suitable for connecting to an electrical arrangement comprising at least two antennas in or on a glazing either by soldering or by capacitive coupling via a surface contact applied to the glazing.

Another objective is to provide a connector suitable for at least two antennas having improved broadband performance in a double band operation.

SUMMARY OF THE INVENTION

These objectives are attained by the present invention according to a first aspect, wherein a connector is provided having the features of claim 1. The connector comprises electrical conductors, each having an input portion, an output portion, and a linear portion extending therebetween.

The input portion has a principal axis at an angle greater than 45 degrees to a principal axis of the linear portion. The output portion is defined by a joining point of first and second linear portions. Alternatively, if first and second linear portions do not join, the output portion is defined as a portion configured to connect to a plug or socket. Average width is defined as total area divided by total length. Total area includes area of a slot, if present. Total length includes length of extension portions, as defined herein below, if present. Average spacing S is defined as a distance between adjacent edges of first and second linear portions, perpendicular to the principal axis of the first linear portion, averaged over the length of the first linear portion. Two axes are substantially parallel if an angle therebetween is less than 45 degrees. The inventor has found that the connector, comprising first and second electrical conductors with first and second linear portions on a flexible base layer wherein an average width W1 of the first linear portion is less than an average width W2 of the second linear portion, has better broadband performance in use than conventional connectors.

Surprisingly, the inventor has found that a first linear portion used for signals in a first frequency band F1 and a second linear portion used for signals in a second frequency band F2, wherein the second frequency band F2 is higher than the first frequency band F1 and wherein average width W2 is greater than average width W1, balances signal strengths in F1 and F2. It is believed that a combination of higher frequency band F2 with wider average width W2 results in relatively lower impedance than a combination of F2 with W1. Therefore second frequency band F2 measured at the second output portion of the connector has a stronger signal than in the prior art.

Surprisingly, in two port configuration, a connector having first and second output portions electrically isolated from each other and so having two pins (plug or socket for connection to at least one electronic unit via two pins) is suitable for signals in a first frequency band F1 and for signals in a second frequency band F2 higher than F1, when the connector has first and second linear portions having average width W1 less than average width W2. A connector according to the invention in two port configuration has two ports connected to two antennas respectively.

Surprisingly, in single port configuration, a connector having first and second output portions electrically connected with each other and so having a single pin (plug or socket for connection to an electronic unit via one pin) is suitable for signals in a first frequency band F1 and for signals in a second frequency band F2 higher than F1, when the connector has first and second linear portions having average width W1 less than average width W2. A connector according to the invention in single port configuration has a single port for two antennas.

The inventor has found that a technical effect of the invention occurs when first and second linear portions extend substantially parallel with each other (i.e. parallel for at least part of, or for most of, their lengths).

First linear portion thickness and second linear portion thickness may be the same, so that the connector can be more easily manufactured by depositing a single thickness of a conductive material on a base layer material. Alternatively, said thicknesses may be different, so as to select first linear portion impedance for signals in a first frequency band F1 and second linear portion impedance suitable for signals in a second frequency band F2.

Conventional connectors having electrical conductors of equal width do not have the advantage of lower impedance of an electrical conductor carrying signals in a higher frequency band F2, and therefore have weaker signals in F2 at a corresponding output portion.

Preferably, first and second output portions are electrically connected with each other. More preferably the first and second output portions form a single plug or a single socket suitable for connection to an electronic unit.

Preferably, the first frequency band F1 is in a range from 0.5 MHz to 299 MHz and the second frequency band F2 is in a range from 300 MHz to 900 MHz. More preferably, the first frequency band is in a range from 50 MHz to 250 MHz and the second frequency band is in a range from 300 MHz to 800 MHz. Most preferably a third frequency band is in a range from 0.5 MHz to 110 MHz.

Preferably, the first linear portion has an average width W1 in a range from 0.1 mm to 3 mm and the second linear portion has an average width W2 in a range from 1 mm to 10 mm. More preferably W1 is in a range from 0.5 mm to 2 mm and W2 is in a range from 4 mm to 9 mm.

Preferably, an average spacing S between the first linear portion and the second linear portion is at least 0.5 mm, more preferably at least 1 mm and most preferably at least 2 mm.

Preferably, an area of the first input portion is greater than an area of the second input portion. Area is defined as length multiplied by width.

Preferably, at least one input portion is either a surface contact suitable for connection by capacitive coupling to an antenna in or on a glazing or a solder pad suitable for connection by soldering to an antenna in or on a glazing.

Preferably, the connector further comprising a third electrical conductor, comprising a third input portion, a third output portion and a third linear portion, extending between the third input portion and the third output portion, wherein the second and third linear portions extend substantially parallel with each other. A third electrical conductor has the advantage of reducing a number of connectors.

Preferably, the second linear portion comprises a slot. The inventor has found that the slot is a means of fine tuning the capacitance of the second linear portion, relative to the first linear portion.

Preferably, first and second linear portions comprise first and second extension portions adjacent first and second input portions, respectively, and wherein the second extension portion has a width less than the average width W2, the first and second extension portions preferably having substantially the same width. The inventor has found that first and second extension portions are a means of minimising parasitic capacitance to virtual electric ground.

Preferably, at least one of first and second input portions comprises a radius portion adjacent the first and/or second linear portions respectively. The radius portion has been found to relieve mechanical stress at a corner with the first and/or second linear portion. This has the advantage that the flexible connector is less likely to tear when a force is applied.

According to the invention from a second aspect, a glazing is disclosed having the features of claim 11.

A glazing having at least first and second antennas secured in or on the glazing and a connector according to the invention, positioned on the glazing for connection to first and second antennas, wherein the connector is electrically connected to the first and second antennas by capacitive coupling or soldering is advantageous because it has superior performance in double band operation.

Preferably, first and second antennas comprise first and second antenna portions, each suitable for receiving signals in free space, first and second coupling electrodes, electrically connected to first and second antenna portions, wherein the glazing further comprises first and second input portions arranged on a surface of the glazing in registration with first and second coupling electrodes, wherein alternating current coupling occurs between the first coupling electrode and the first input portion and between the second coupling electrode and the second input portion. The inventor has found that alternating current coupling is achievable between a first coupling electrode in the form of a metal foil and a first input portion also in the form of a metal foil. Alternatively, the inventor has found that the first coupling electrode can be in the form of a metal wire shaped for example as a spiral and the first input portion can in the form of a metal foil overlapping the metal wire. Advantageously low impedance is achieved when the length of wire is an odd multiple of a quarter of an effective wavelength in the glazing.

Preferably, the glazing further comprises an edge, an obscuration band extending from the edge to an inner edge of the obscuration band, wherein first and second coupling electrodes are positioned parallel to the edge of the glazing, such that first and second input portions are positioned between the edge of the glazing and the inner edge of the obscuration band.

Preferably, the glazing comprises a transparent electrical insulator. Preferably, the glazing comprises toughened glass or laminated glass or transparent plastic. Preferably the glazing is monolithic glazing comprising one sheet of toughened glass.

Preferably first and second antennas are wires in or on the glazing or are conductive ink printed on a surface of the glazing. Preferably the conductive ink comprises silver.

According to the invention from a third aspect, an antenna system is disclosed having the features of claim 15.

An antenna system comprising a vehicle body, having an opening, surrounded by at least one edge of the body and a glazing according to the invention, mounted in the opening, wherein the at least one edge of the body surrounding the opening is substantially parallel with at least one of first, second or third input portions is advantageous because the opening acts as a frame member, and provides a virtual electric ground for the first and second antennas, which improves broadband performance.

BRIEF DESCRIPTION OF THE DRAWINGS

The invention is further disclosed in the following drawings.

DETAILED DESCRIPTION OF THE INVENTION

The invention is disclosed in non-limiting examples as follows.

Figure 1A:
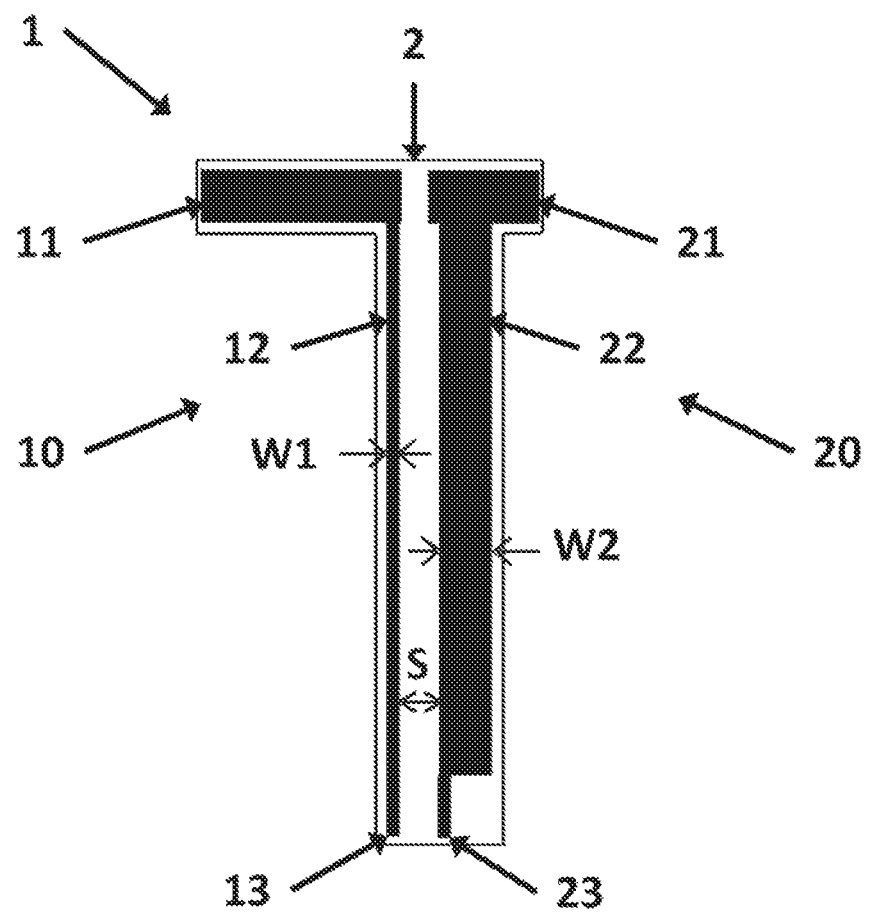
FIG. 1A shows a connector according to the invention in two port configuration, for two frequency bands comprising first and second linear portions, having first average width W1 and second average width W2, and having an average spacing S, wherein first and second output portions are electrically isolated from each other.
Figure 1:
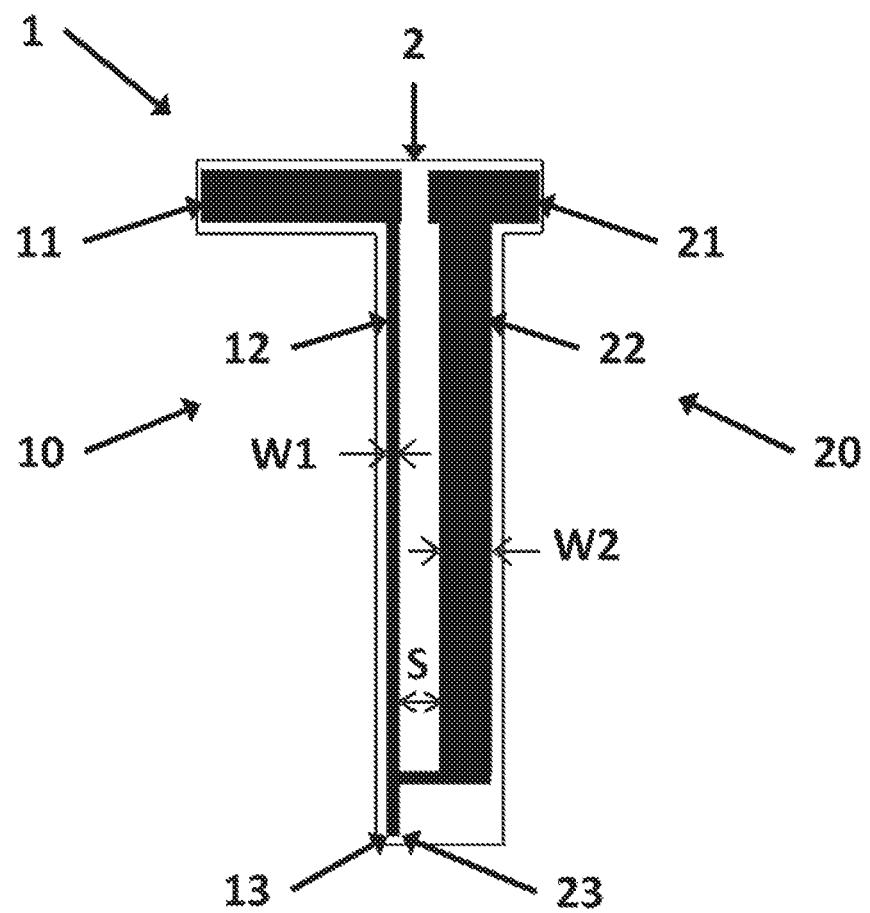
FIG. 1 shows a connector according to the invention in single port configuration, for two frequency bands comprising first and second linear portions, having first average width W1 and second average width W2, and having an average spacing S, wherein first and second output portions are electrically connected with each other.

FIG. 1A and FIG. 1 are schematic diagrams of the invention in two port configuration and single port configuration respectively. In two port configuration, first and second output portions 13, 23 are electrically isolated from each other. In single port configuration, first and second output portions 13, 23 are electrically connected with each other.

FIG. 1A and FIG. 1 show a connector 1 comprising a flexible base layer 2. First and second electrical conductors 10, 20 are provided on the base layer, consisting of first and second input portions 11, 21; first and second output portions 13, 23 and first and second linear portions 12, 22 extending between the first and second input portions and first and second output portions respectively.

First and second linear portions 12, 22 extend substantially parallel with each other, so as to maximise a linear capacitance effect therebetween.

An average width W1 of the first linear portion 12 is less than an average width W2 of the second linear portion 22. Average spacing between first and second linear portions is S.

The base layer material is selected to withstand conditions in manufacturing and in service. For example, polyimide is a plastic which is tear-resistant and heat-resistant, capable of withstanding temperatures during soldering approximately 270 degrees C. and in an autoclave approximately 160 degrees C. for laminating. A suitable polyimide film is obtainable under the trade name "Kapton™" from DuPont (E.I. du Pont de Nemours and Company, Wilmington, Del., USA). Alternatively a connector which is applied on a surface of a glazing by an adhesive pad does not need to withstand such high temperatures, so a base layer for a connector using capacitive coupling may be manufactured from polyethylene naphthalate (PEN), which withstands a temperature of 140 degrees C. Base layer thickness is typically in a range from 10 microns to 250 microns; a preferred thickness is 25 microns. First and second electrical conductors are typically metal foil, preferably copper foil, and thickness is typically in a range from 10 microns to 250 microns; a preferred thickness is 35 microns. A cover layer (not shown) may be provided on the electrical conductors for electrical insulation.

Figure 2:
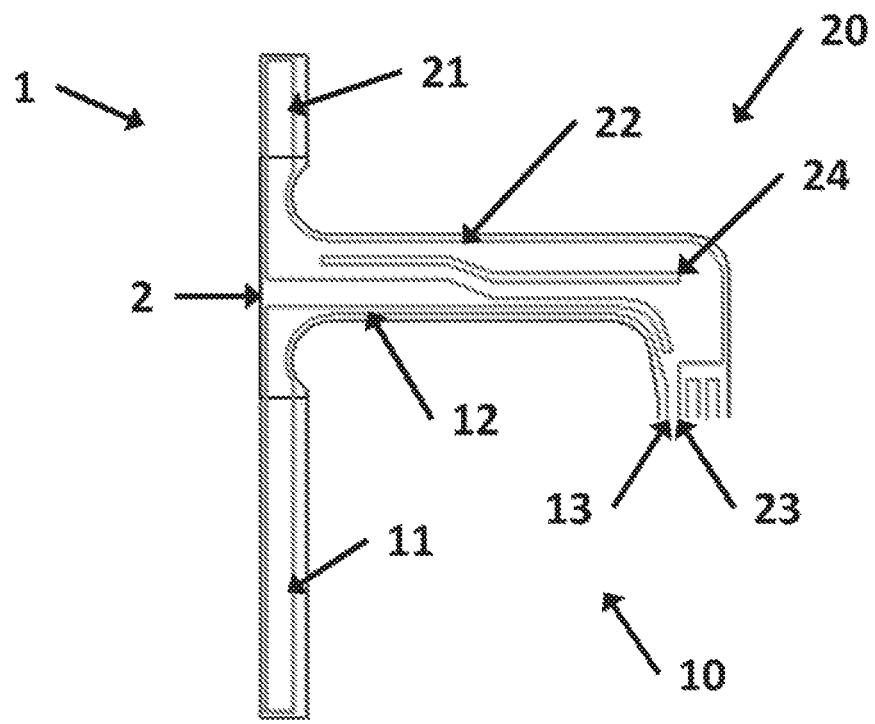
FIG. 2 shows a connector according to the invention or two frequency bands.

FIG. 2 shows a connector 1 wherein first and second linear portions 12, 22 are spaced by a narrow gap for half their length and a broad gap for the other half. In one embodiment, the narrow gap is 1 mm and the broad gap is 3 mm. The second linear portion 22 has a slot 24, approximately 1 mm wide, which extends almost the full length of the second linear portion, and substantially parallel to the principal axis thereof.

First and second input portions 11, 21 are configured perpendicular to a principal axis of the first linear portion 12. First and second input portions are configured with radius portions adjacent the first and second linear portions respectively.

First and/or second input portions 11, 21 are configured to have large area suitable for capacitive coupling, as shown, or small area suitable for soldering. In an advantageous embodiment (not shown), first input portion 11 may be configured to have a small area as a solder pad suitable for signals in a low frequency band F1 and second input portion 21 may be configured to have a large area suitable for capacitive coupling of signals in a high frequency band F2. This embodiment has the advantage of saving space, by reducing the size of the first input portion 11.

First and second linear portions 12, 22 are joined to provide output portions 13, 23 thus forming a single output suitable for soldering to one pin of a three pin connector. Signals in first and second frequency bands F1, F2 are provided at one output, thus reducing the number of separate electronic units, such as amplifiers.

Figure 3:
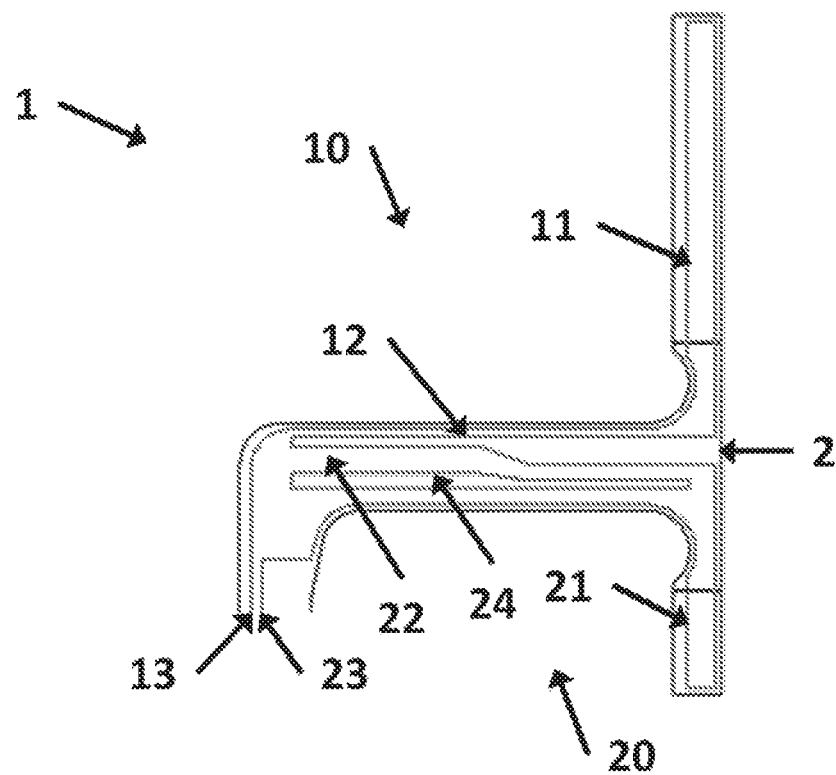
FIG. 3 shows another connector according to the invention for two frequency bands.

FIG. 3 shows a similar connector to FIG. 2.

Figure 4:
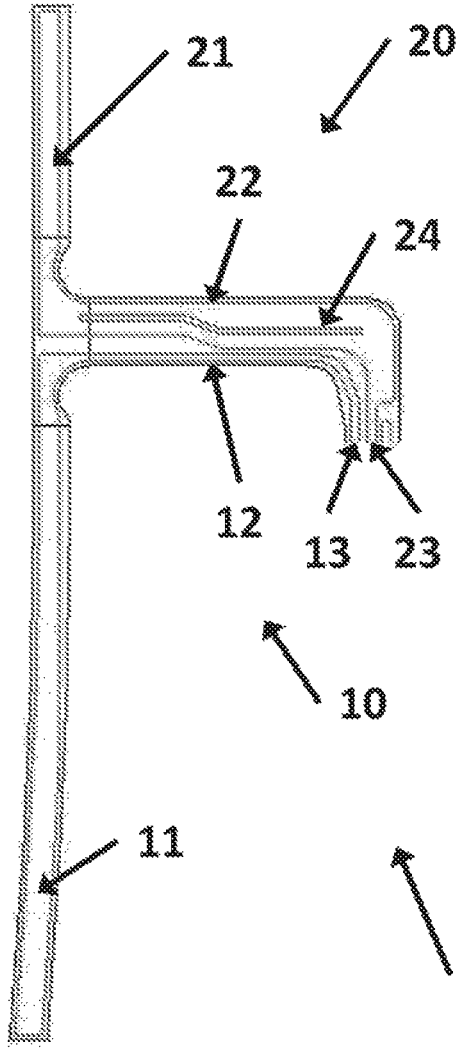
FIG. 4 shows a connector according to the invention for two frequency bands and having a long first input portion.

FIG. 4 shows a similar connector to FIG. 2, but with a first input portion 11, suitable for a lower frequency band having an area greater than the area of a second input portion 21, which is suitable for a higher frequency band. First and second output portions 13, 23 are separate, suitable for connection to two pins of a plug.

Figure 5:
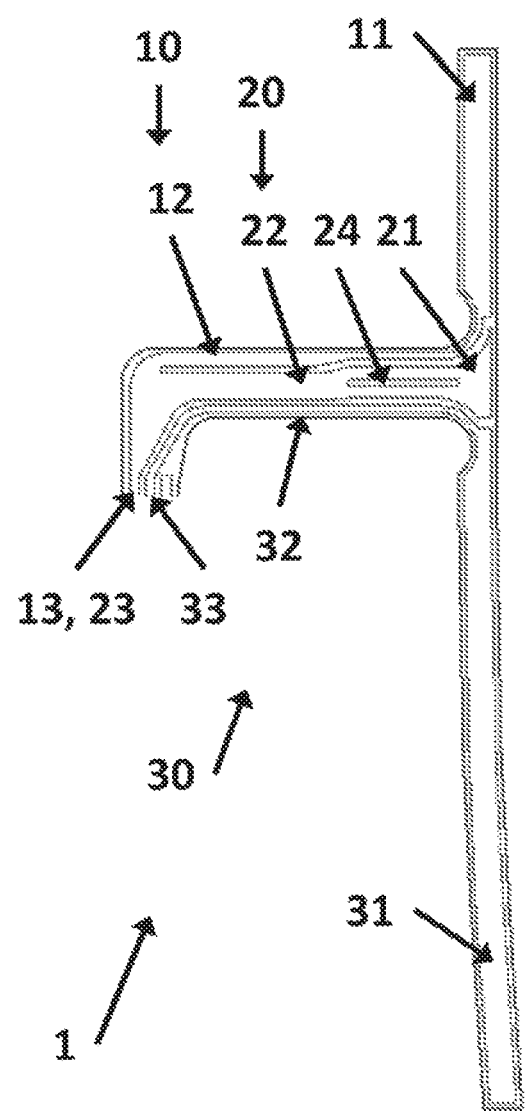
FIG. 5 shows a connector according to the invention for three frequency bands and having a long first input portion.

FIG. 5 shows a similar connector to FIG. 2 and further comprising a third electrical conductor 30, consisting of a third input portion 31, a third output portion 33, and a third linear portion 32, extending therebetween. The second linear portion 22 is provided with a slot 24, extending less than half its length and parallel with a principal axis of the second linear portion 22. Signals in a first frequency band F1 are conveyed from a first input portion 11 via a first linear portion 12 to a first output portion 13. Signals in second frequency band F2 are conveyed from a second input portion 21 via a second linear portion 22 to a second output portion 23, wherein the first output portion 13 and the second output portion 23 are electrically connected with each other. Signals in a third frequency band F3 are conveyed from a third input portion 31 via a third linear portion 32 to a third output portion 33, which is separate from the first and second output portions 13, 23. F2 is higher than F1 and F3. For example, frequency band F1 is less than 240 MHz, frequency band F2 is 300 MHz to 800 MHz and frequency band F3 is up to 110 MHz.

In FIG. 2, FIG. 3 and FIG. 4, first and second output portions 13, 23 are arranged at approximately 90 degrees to a main axis of first and second linear portions 12, 22. In FIG. 5, first, second and third output portions 13, 23, 33 are angled at approximately 90 degrees to a main axis of first, second and third linear portions 12, 22, 32. Arranging an output portion at approximately 90 degrees to a main axis of a linear portion is advantageous for easy connection to an amplifier or similar electronics unit, typically positioned parallel to an A-pillar at left or right side of a windscreen.

In FIG. 2, FIG. 3 and FIG. 4, first and second input portions 13, 23 are arranged at approximately 90 degrees to a main axis of first and second linear portions 12, 22. In FIG. 5, first, second and third input portions 13, 23, 33 are angled at approximately 90 degrees to a main axis of first, second and third linear portions 12, 22, 32. Arranging an input portion at approximately 90 degrees to a main axis of a linear portion is advantageous to avoid stray capacitance between a linear portion and a body of a vehicle.

Figure 6:
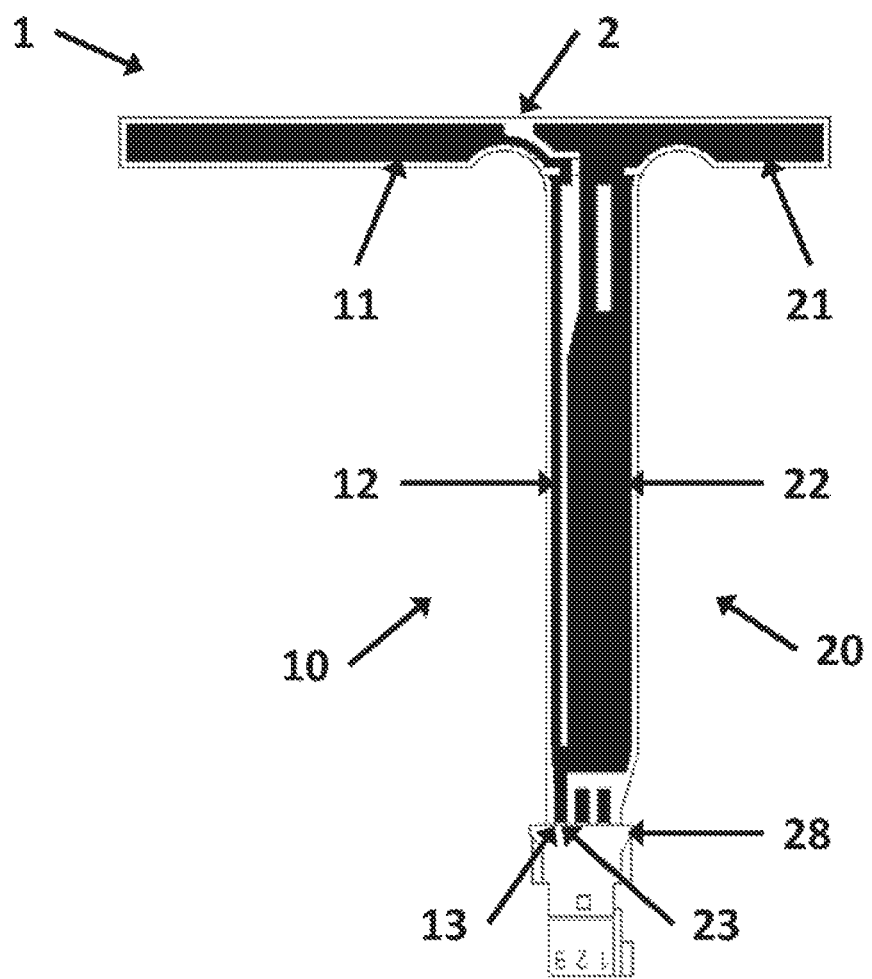
FIG. 6 shows a connector according to the invention for two frequency bands and having a straight first output portion with a plug.

FIG. 6 shows a similar connector to FIG. 2, provided with a plug 28, having one pin for signals in first and second frequency bands F1, F2.

Figure 7:
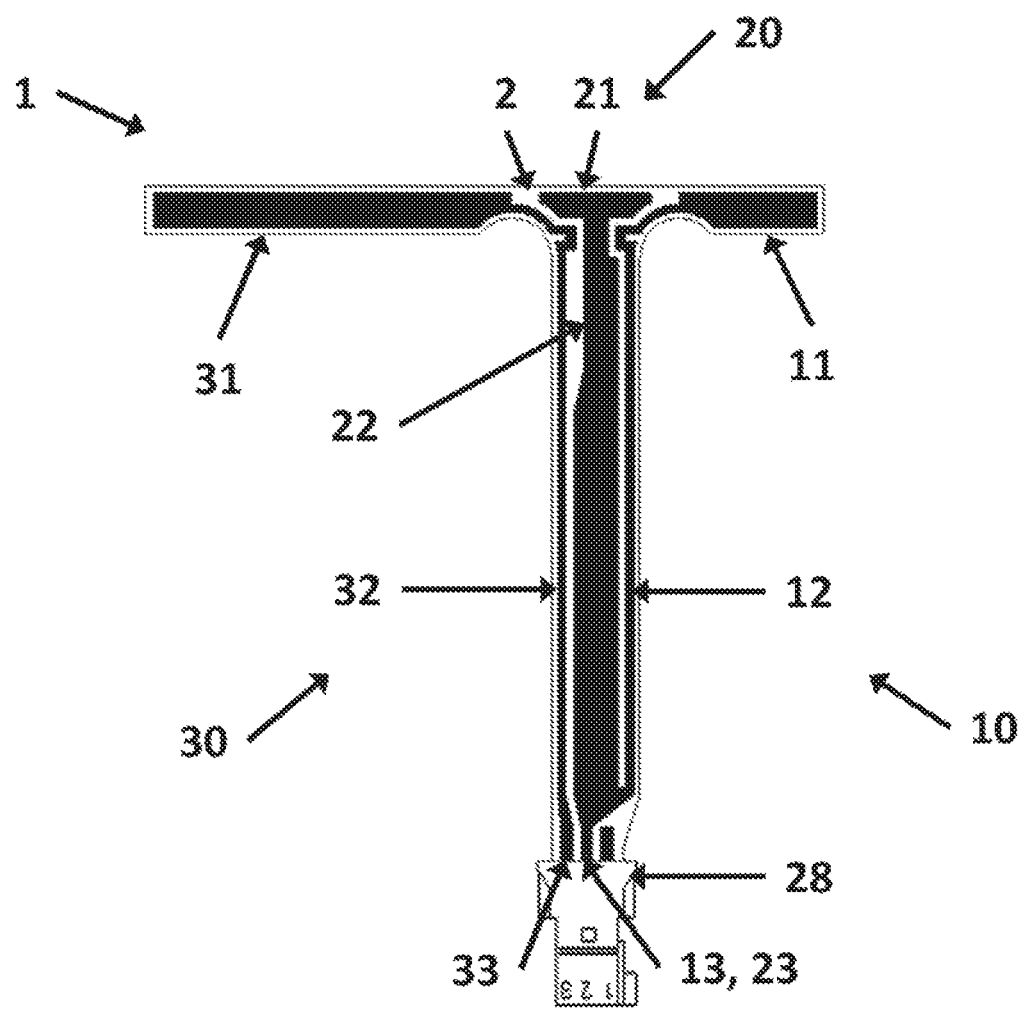
FIG. 7 shows a connector according to the invention for three frequency bands and having a straight first output portion with a plug.

FIG. 7 shows a similar connector to FIG. 5, provided with first, second and third electrical conductors 10, 20, 30 and a plug 28. Low frequency signals in a first frequency band F1 are conveyed to a first output portion 13. High frequency signals in a second frequency band F2 are conveyed to a second output portion 23, wherein first and second output portions 13, 23 are connected with each other, and are connected to a second pin of the plug 28. Unlike FIG. 5, the second electrical conductor does not have a slot. Low frequency signals in a third frequency band F3 are conveyed to a third output portion 33, which is separate from first and second output portions 13, 23, and connected to a third pin of the plug 28.

Figure 8:
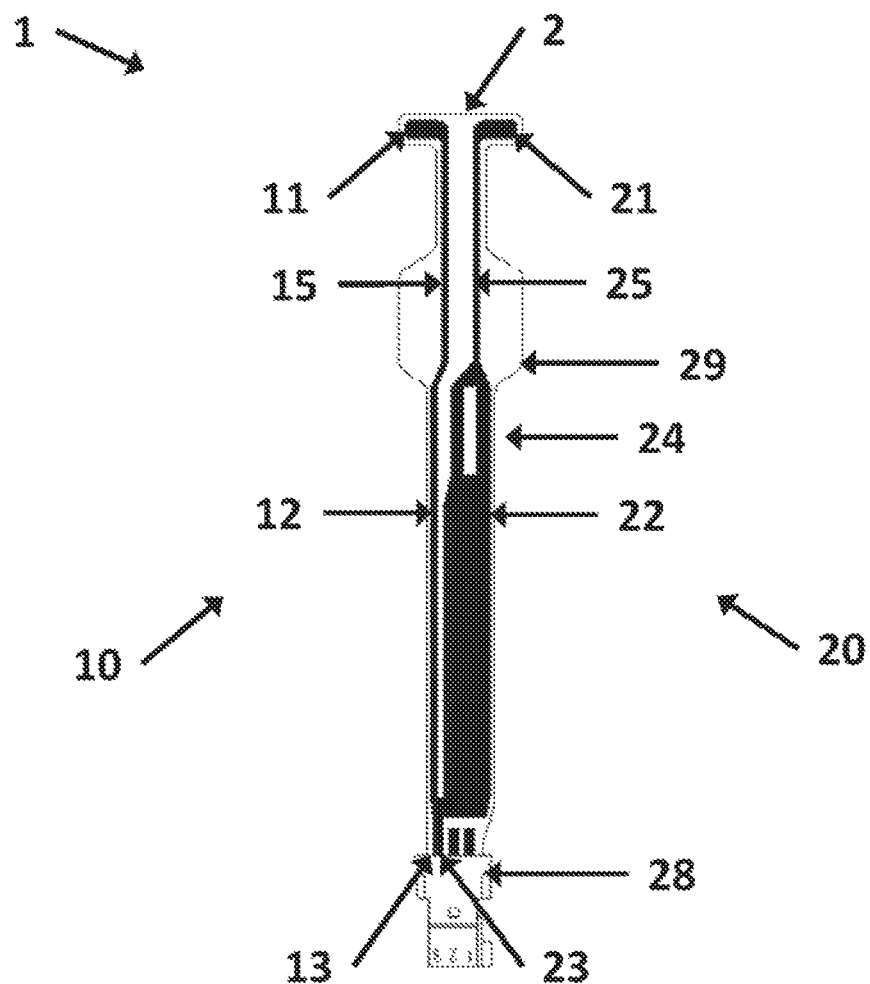
FIG. 8 shows a connector according to the invention for two frequency bands and provided with solder pads for first and second input portions.

FIG. 8 shows a similar connector to FIG. 2, but first and second input portions 11, 21 are solder pads. The solder pads are suitable for soldering to antennas, for example printed on an inner surface of a sheet of glazing material or embedded in a sheet of interlayer material before it is positioned between two sheets of glazing material to make a laminated glass.

First and second linear portions 12, 22 comprise first and second extension portions 15, 25 adjacent the first and second input portions 11, 21. First and second extension portions 15, 25 are electrical conductors of substantially equal width less than the average width W2. The purpose of first and second extension portions 15, 25 is to minimise parasitic capacitance occurring between the electrical conductors and virtual electric ground, when the connector is installed adjacent a metallic body, for example a vehicle body. This effect is particularly significant where the amplifier housing electric ground is directly connected to the vehicle body electric ground.

The flexible base layer 2 has a wide portion 29 positioned in the region of the first and second extension portions 15, 25. The purpose of the wide portion 29 is to provide a large area for bonding the connector 1 to a surface of a glazing, thereby increasing mechanical strength of the bond and reducing a risk of tearing at an edge of the glazing.

Figure 9:
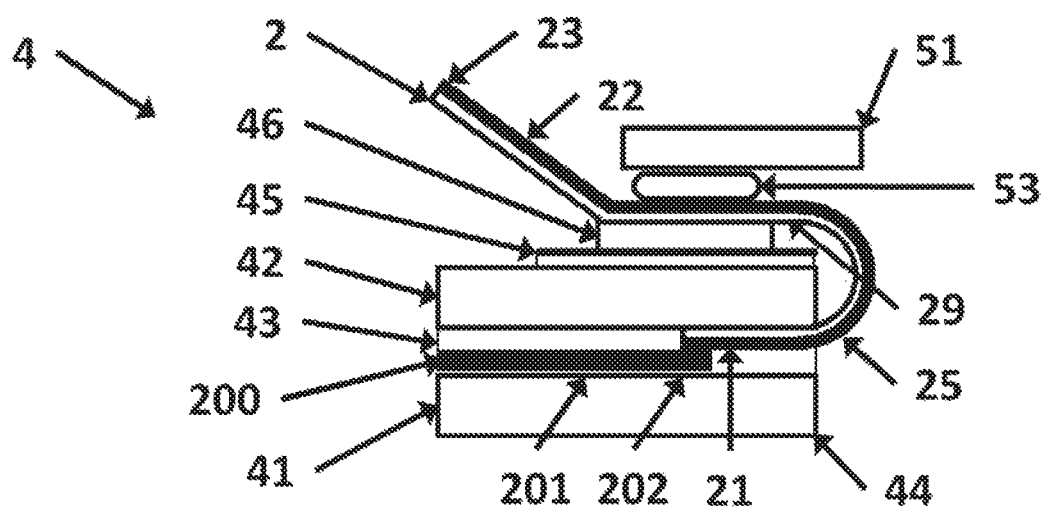
FIG. 9 shows a glazing according to the invention in cross-section, having a connector as shown in FIG. 8 and an adhesive pad.

FIG. 9 shows a glazing 4 in cross-section, bonded to a vehicle 51. The glazing 4 comprises first and second sheets of glazing material 41, 42 and a sheet of interlayer material 43 therebetween. A second antenna 200, comprising a second antenna portion 201 and a second coupling electrode 202, is wire embedded in the sheet of interlayer material 43. A connector as shown in FIG. 8, having a second input portion 21 configured as a solder pad, is soldered to the second coupling electrode 202. A second extension portion 25 extends towards an edge 44 of the glazing, emerges from between the first and second sheets of glazing material 41, 42 and turns 180 degrees. A base layer 2 has a wide portion 29 positioned on an external surface of the glazing, between an inner edge 45 of an obscuration band and the edge 44 of the glazing. The wide portion 29 is bonded to an external surface of the glazing by an adhesive pad 46. A second linear portion 22 extends from the adhesive pad 46 to a second output portion 23. A width of the second extension portion 25 is less than a width W2 of the second linear portion 22, so that parasitic capacitance with the vehicle body 51 is minimised. The glazing 4 is secured to the vehicle body 51 by means of a sealant 53.

Figure 10:
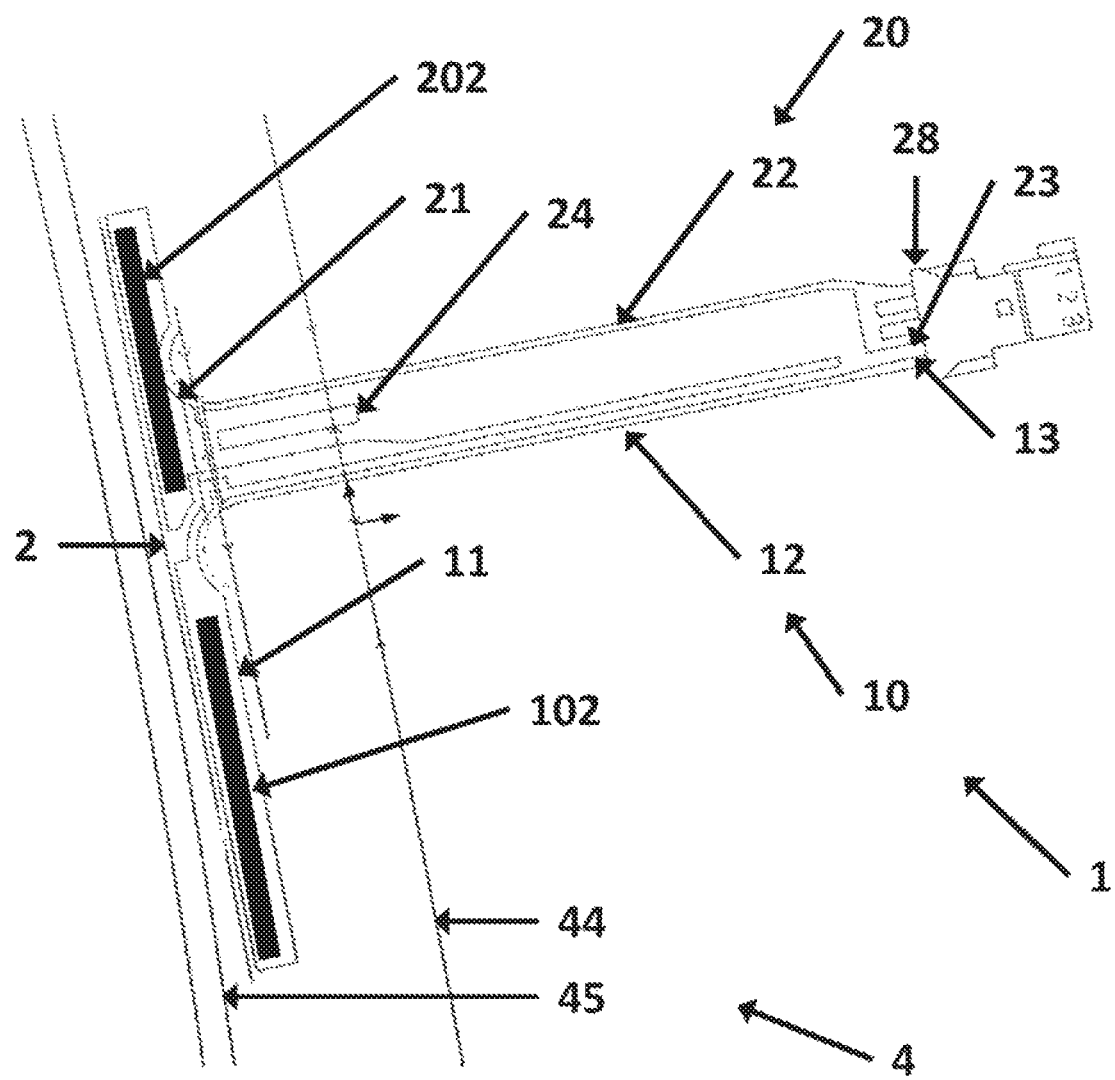
FIG. 10 shows a glazing according to the invention having first and second coupling portions for antennas and a connector for two frequency bands.

FIG. 10 shows a glazing 4, having an edge 44. An obscuration band extends from the edge 44 of the glazing to an inner edge 45 of the obscuration band. First and second coupling electrodes 102, 202 are positioned parallel to the edge 44 and are hidden from view by the obscuration band. Connector 1 is similar to FIG. 6.

Figure 11:
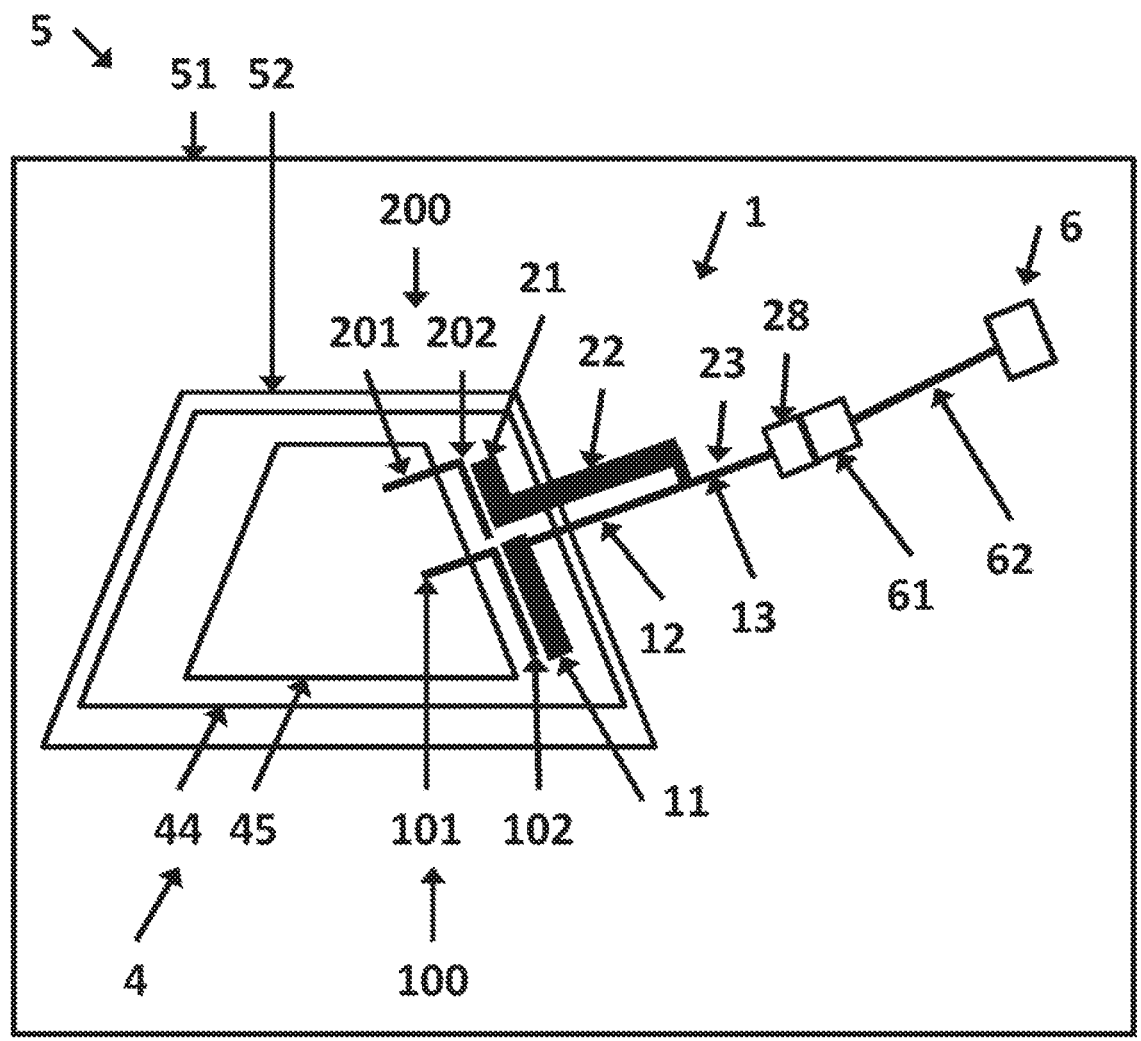
FIG. 11 shows an antenna system according to the invention comprising a vehicle body, an electronic unit, a glazing having two antennas and a connector.

FIG. 11 shows an antenna system in diagrammatic form. The antenna system 5 in this case is a motor vehicle, comprising a vehicle body 51, having an opening 52, suitable for a glazing 4. The glazing has first and second antennas 100, 200, comprising first and second antenna portions 101, 201 connected to first and second coupling electrodes 102, 202 respectively. Signals in a first frequency band F1 are transmitted by capacitive coupling from coupling electrode 102 to first input portion 11, then by conduction via first linear portion 12 to first output portion 13. Signals in a second frequency band F2 are transmitted by capacitive coupling from coupling electrode 202 to second input portion 21, then by conduction via second linear portion 22 to second output portion 23, electrically connected to the first output portion 13 and to a shared pin on a plug 28. An electronic unit 6, such as a radio or TV, is connected to the plug 28 via, for example, an amplifier 61 and a cable 62. The amplifier 61 is a broadband unit suitable for processing signals in frequency bands F1, F2. The amplifier 61 should be as close to the first and second antennas 100, 200 as possible. Broadband performance has been simulated by computer modelling and has been found to be better with a connector according to the invention than with conventional connectors.

LIST OF REFERENCES

1: connector
2: base layer
10, 20, 30: first, second, third electrical conductors
11, 21, 31: first, second, third input portions
12, 22, 32: first, second, third linear portions
13, 23, 33: first, second, third output portions
24: slot
15, 25: first, second extension portions
28: plug (or socket)
29: wide portion
4: glazing
41, 42: first, second sheets of glazing material; 43: sheet of interlayer material
44: edge of a glazing; 45: inner edge of an obscuration band
5: antenna system
51: vehicle body; 52: opening in vehicle body; 53: sealant
6: electronic unit; 61: amplifier; 62: cable
100, 200: first, second antennas
101, 201: first, second coupling portions
102, 202: first, second antenna portions
F1, F2: first, second frequency bands
S: average spacing
W1, W2: average width of first, second linear portions

The invention claimed is:

1. A connector, suitable for at least two antennas, the connector comprising:
   a base layer, made of a flexible material
   first and second electrical conductors secured on the base layer
   wherein the first electrical conductor is suitable for signals in a first frequency band F1 and the second electrical conductor is suitable for signals in a second frequency band F2
   wherein the second frequency band F2 is higher than the first frequency band F1
   wherein first and second electrical conductors comprise first and second input portions, first and second output portions and first and second linear portions extending between the first and second input portions and first and second output portions respectively
   wherein the first and second linear portions extend substantially parallel with each other characterised in that wherein an average width W1 of the first linear portion is less than an average width W2 of the second linear portion; and
   wherein at least one input portion is either a surface contact suitable for connection by capacitive coupling to an antenna in or on a glazing or a solder pad suitable for connection by soldering to an antenna in or on a glazing.

2. A connector according to claim 1, wherein first and second output portions are electrically connected with each other.

3. A connector according to claim 1, wherein the first frequency band F1 is in a range from 0.5 MHz to 299 MHz and the second frequency band F2 is in a range from 300 MHz to 900 MHz.

4. A connector according to claim 1, wherein the first linear portion has an average width W1 in a range from 0.1 mm to 3 mm and the second linear portion has an average width W2 in a range from 1 mm to 10 mm.

5. A connector according to claim 1, wherein an average spacing between the first linear portion and the second linear portion is at least 0.5 mm.

6. A connector according to claim 1, wherein an area of the first input portion is greater than an area of the second input portion.

7. A connector according to claim 1, further comprising a third electrical conductor, comprising a third input portion, a third output portion and a third linear portion, extending between the third input portion and the third output portion, wherein the second and third linear portions extend substantially parallel with each other.

8. A connector according to claim 1, wherein the second linear portion comprises a slot.

9. A connector according to claim 1, wherein first and second linear portions comprise first and second extension portions adjacent first and second input portions and wherein the second extension portion has a width less than the average width W2, the first and second extension portions preferably having substantially the same width.

10. A connector according to claim 1, wherein first and second output portions form a single plug or a single socket suitable for connection to an electronic unit.

11. A connector according to claim 1, wherein the first linear portion has an average width W1 in a range from 0.5 mm to 2 mm and the second linear portion has an average width W2 in a range from 4 mm to 9 mm.

12. A connector according to claim 1, wherein an average spacing between the first linear portion and the second linear portion is at least 1 mm.

13. A connector according to claim 1, wherein an average spacing between the first linear portion and the second linear portion is at least 2 mm.

14. A glazing, suitable for installation in an opening of a vehicle, the glazing comprising:
  first and second antennas, secured in or on the glazing
  a connector according to claim 1, positioned for connection to first and second antennas
  wherein the connector is electrically connected to the first and second antennas by capacitive coupling or soldering.

15. A glazing according to claim 14, wherein first and second antennas comprise:
  first and second antenna portions, each suitable for receiving signals in free space
  first and second coupling electrodes, electrically connected to first and second antenna portions
  wherein the glazing further comprises first and second input portions arranged on a surface of the glazing in registration with first and second coupling electrodes
  wherein alternating current coupling occurs between the first coupling electrode and the first input portion and between the second coupling electrode and the second input portion.

16. A glazing according to claim 15, further comprising an edge of the glazing, an obscuration band extending from the edge of the glazing an inner edge of the obscuration band, wherein first and second coupling electrodes are positioned parallel to the edge of the glazing, such that first and second input portions are positioned between the edge of the glazing and the inner edge of the obscuration band.

17. A glazing according to claim 14, wherein the glazing comprises toughened glass or laminated glass.

18. An antenna system comprising a motor vehicle, the vehicle comprising:
  a vehicle body, having an opening surrounded by at least one edge of the body
  a glazing according to claim 14, mounted in the opening
  wherein the at least one edge of the body surrounding the opening is substantially parallel with at least one of first, second or third input portions.

* * * * *